United States Patent [19]

Stein et al.

[11] Patent Number: 4,725,747

[45] Date of Patent: Feb. 16, 1988

[54] INTEGRATED CIRCUIT DISTRIBUTED GEOMETRY TO REDUCE SWITCHING NOISE

[75] Inventors: Dale P. Stein; Sam M. Weaver; James C. Spurlin; Steven E. Marum, all of Sherman, Tex.

[73] Assignee: Texas Instruments Incorporated, Dallas, Tex.

[21] Appl. No.: 902,267

[22] Filed: Aug. 29, 1986

[51] Int. Cl.[4] ............... H03K 17/687; H03K 5/13; H01L 29/78; H01L 27/02
[52] U.S. Cl. ............................ 307/579; 307/303; 307/263; 307/443; 307/451; 307/594; 307/601; 307/481; 307/605; 357/23.1; 357/23.8; 357/23.14; 357/42; 357/51; 357/59
[58] Field of Search ............ 307/303, 263, 443, 451, 307/481, 579, 594, 597, 601, 605, 607; 357/23.1, 23.8, 23.14, 42, 51, 59 G

[56] References Cited

U.S. PATENT DOCUMENTS 4,152,717  5/1979  Satou et al. ................. 357/23
4,462,041  7/1984  Glenn ........................... 357/23

Primary Examiner—Martin H. Edlow
Assistant Examiner—Don Featherstone
Attorney, Agent, or Firm—Leo N. Heiting; Mel Sharp

[57] ABSTRACT

A complimentary output pair (10) having a P-channel transistor (12) and an N-channel transistor (14) prevents output voltage spikes due to rapid changes in current with respect to time at the $V_{cc}$ power supply and ground (32) nodes by using a "graded turn-on." Both the P-channel transistor (12) and the N-channel (14) utilize a serpentine polysilicon gate (16), (24), in order to sequentially turn on the sub-transistors in response to a changing input. Pull-up (36) and pull-down (40) transistors are used to turn the sub-transistors (21a–j, 29a–f) off simultaneously.

22 Claims, 5 Drawing Figures

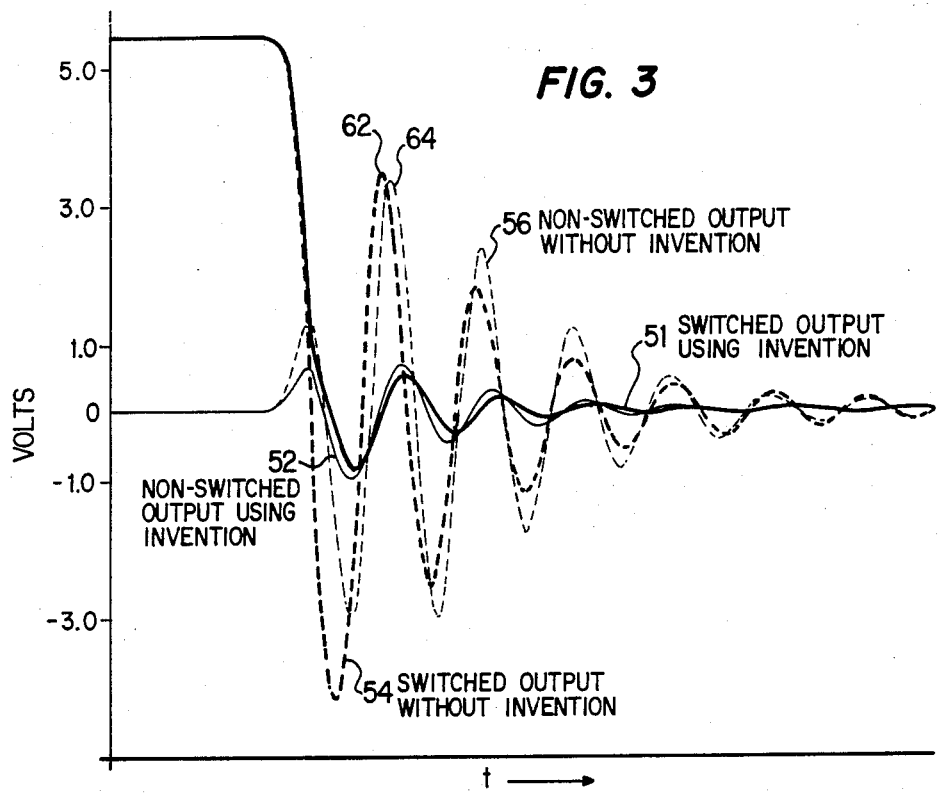
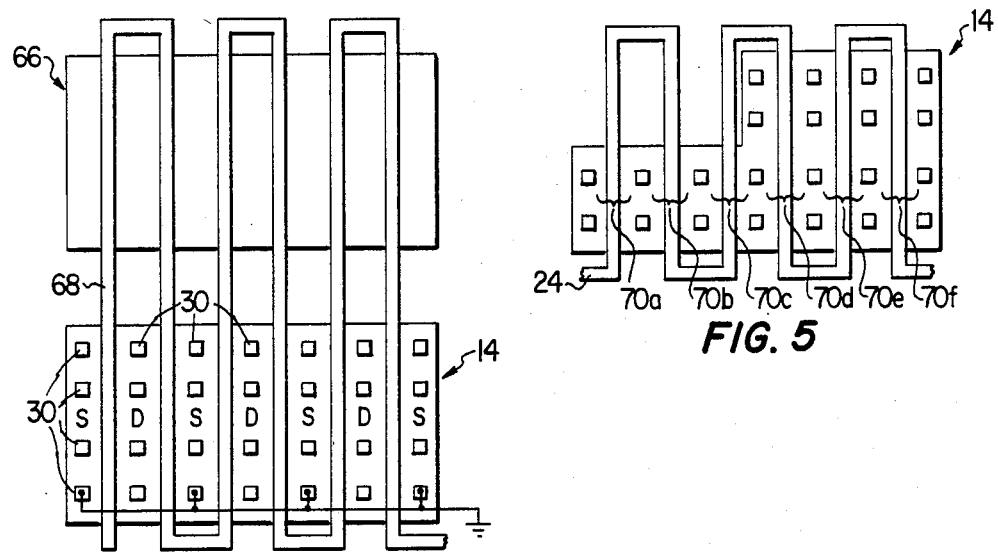

INTEGRATED CIRCUIT DISTRIBUTED GEOMETRY TO REDUCE SWITCHING NOISE

TECHNICAL FIELD OF THE INVENTION

This invention pertains in general to integrated circuits, and more particularly relates to reducing output noise of digital integrated circuits.

BACKGROUND OF THE INVENTION

Advancement in integrated circuit technology has lead to vast improvements in the speed of integrated circuits, i.e. the time in which the output of a circuit reacts in response to a new input. Increasing integrated circuit speed has resulted in faster rise and fall times of the output voltages. Similarly, the fast rise and fall times of the output voltages have resulted in abrupt transitions of output current.

While faster speeds are very desirable, the abrupt transition of output currents has created serious problems. The package which holds an integrated circuit device has metallic leads which allow interconnection of the device on a circuit board. Each lead has a small inductance associated with it. The leads are connected to the integrated circuit using bonding wire, which also has an inductance associated with it. Voltage is related to inductance and the time rate of change of current by the equation $E = L \cdot dI/dT$, where L is the measure of inductance, and dI/dT is the change in current with respect to time. The abrupt transition of output currents creates a large change of current at the ground and power supply leads and in the bonding wire, resulting in ground and power supply voltage spikes. These voltage spikes affect the output voltages of the device, and cause output ringing, ground bounce, and false signals.

Systems have been heretofore developed which attempt to alleviate this problem by reducing the amount of inductance (L) present at the leads. One method provides multiple power supply and ground leads in order to reduce the inductance (L) that generates the voltage spikes. However, the reduction in inductance is often insufficient to eliminate voltage spikes at the output of many devices, and may necessitate using a larger package to carry the same integrated circuit.

Another method attempts to reduce the effect of the voltage spikes by bifurcating the surge of current through the lead inductances of the package. The large pull-down transistor in the standard CMOS buffer is split into two devices separated by a resistor. The resistor delays the turn-on of the second device so that the circuit produces two smaller current spikes rather than one large current spike. While somewhat slowing the edge of the output current transition, this circuit is often insufficient to bring the dI/dT term to a value which will eliminate voltage spikes at the power and ground leads.

From the foregoing, it may be seen that a need has arisen for a technique which produces a smooth change of output current with respect to time in response to switching output voltage states, in order to reduce or eliminate voltage spikes. Furthermore, a need has arisen for circuitry capable of protecting against false outputs without substantially increasing the number of devices needed to implement the circuitry.

SUMMARY OF THE INVENTION

In accordance with the present invention, a integrated circuit is provided which substantially eliminates or reduces the disadvantages and problems associated with switching noise in prior high speed integrated circuits.

In accordance with another aspect of the invention, a transistor is provided for reducing output switching noise, comprising a substrate having semiconductor areas forming a plurality of transistor regions, and an elongated gate having a predetermined resistance. A signal applied to one end region of the gate propagates along the length of the gate during a predetermined time interval. The transistor regions sequentially conduct in response to the signal propagating along the elongated gate until all of the transistor regions are conducting. The sequential conduction of the transistor regions reduces the generation of output noise by limiting the change of output current with respect to time.

In another embodiment of the invention, the elongated gate extends to a second semiconductor region separate from the semiconductor surface areas, such that the resistance and capacitance along the elongated gate is increased.

In another important aspect of the invention, a transistor circuit includes a body of semiconductor material having a plurality of active semiconductor regions forming alternating transistor sources and drains. An elongated conductive gate is disposed adjacent to the active semiconductor regions to form a plurality of interconnected transistors. The gate is configured in a continuous serpentine manner, such that a gate signal applied to one end propagates serially along the gate to sequentially render the transistors conductive. A second plurality of active semiconductor regions with a second elongated serpentine gate may be added, and the drains of the first plurality of active semiconductor regions and the drains of the second plurality of active semiconductor regions may be connected to form an output.

In another embodiment of the transistor circuit, a plurality of turn off transistors are connected to the first and second elongated serpentine gates such that the transistor regions will turn on sequentially in response to a signal, but turn off substantially simultaneously in response to the inverted signal.

BRIEF DESCRIPTION OF THE DRAWINGS

For a more complete understanding of the present invention and the advantages thereof, reference is now made to the following description in conjunction with the accompanying drawings in which:

FIG. 3 illustrates a comparison of output voltages of circuits incorporating the invention with those not incorporating the invention, each acting in response to simultaneously switching outputs;

FIG. 4 illustrates an alternative layout in accordance with the invention for increasing the R-C time constant in the path of the serpentine gate of an N-channel device; and FIG. 5 illustrates another alternative layout to further reduce the output current transition created by the N-channel device of the complimentary output pair.

DETAILED DESCRIPTION OF THE INVENTION

Figure 1:
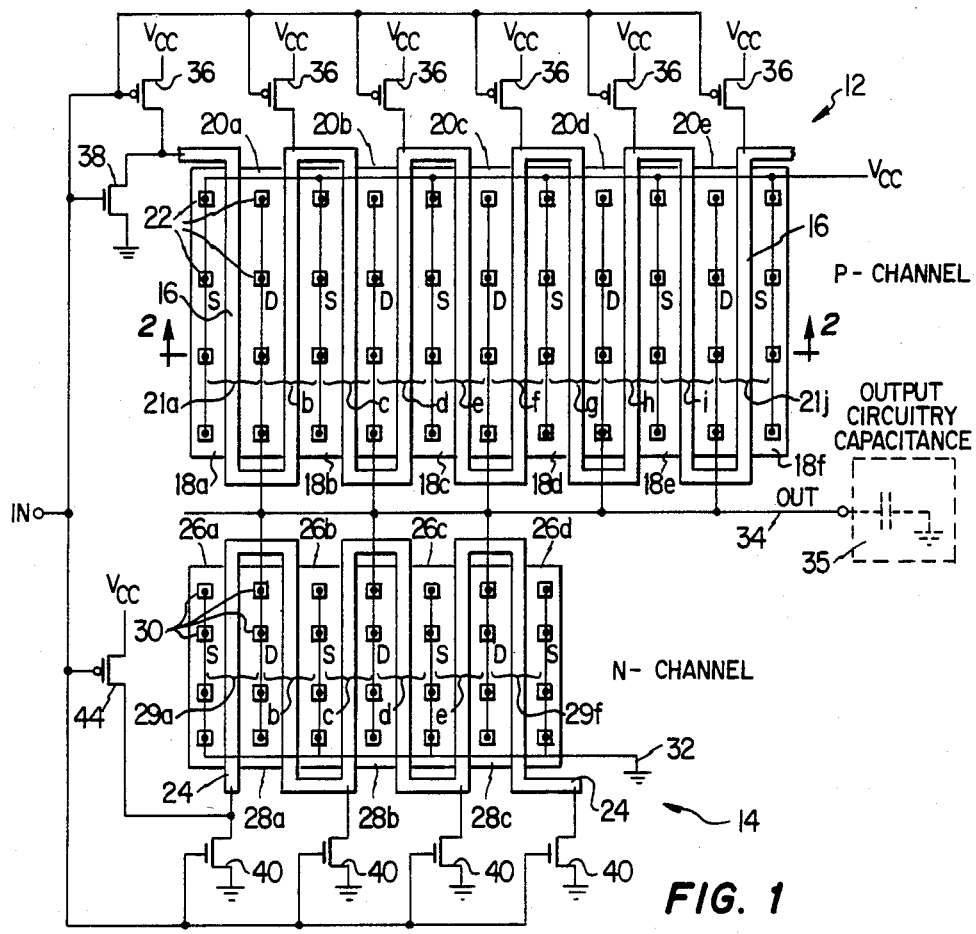
FIG. 1 illustrates a layout of a circuit implemented in accordance with the present invention in a CMOS chip to reduce abrupt output current transitions with respect to time.

The preferred embodiment of the present invention is best understood by referring to FIG. 1 of the Drawings, like numerals being used for like and corresponding parts of the various Drawings. FIG. 1 illustrates a circuit used to reduce the sharp current transitions in a CMOS device. An output CMOS transistor pair, generally referred to by the reference number 10, includes a P-channel transistor 12 and an N-channel transistor 14.

The P-channel transistor 12 includes a polysilicon serpentine gate 16 disposed between a plurality of elongated P-channel sources 18a-f and elongated P-channel drains 20a-e, forming sub-transitors identified by brackets 21a-j. As may be seen, gate 16 is formed of elongated portions which extend parallel to the sources and drains, with the elongated portions joined at alternating upper and lower regions thereof by short portions perpendicular to the sources and drains to form a single continuous serially-connected gate for the entire transistor 12. A plurality of metal contacts 22 are formed on each P-channel source 18a-f and P-channel drain 20a-e. The P-channel sources 18a-f are connected to $V_{cc}$ (the power supply lead), generally held at five volts.

The N-channel transistor 14 also employs a polysilicon serpentine gate 24 separating a plurality of elongated N-channel sources 26a-d and N-channel drains 28a-c, forming sub-transistors identified by brackets 29a-f. Gate 24 is constructed similarly to gate 16 to form a single serially-connected gate for the entire transistor 14. Each of the N-channel sources 26a-d and N-channel drains 28a-c have a plurality of metal contacts 30. The N-channel sources 26a-d are connected to ground.

The output 34 of the output pair 10 is connected to the P-channel drains 20a-e and the N-channel drains 28a-c. A capacitor 35 is shown in phantom to represent the capacitance of the circuitry connected to the output.

A plurality of P-channel pull-up transistors 36 are connected at their gates to the input terminal 37 of the output pair 10. The drains of transistors 36 are connected at successive positions on the P-channel serpentine gates 16 and the sources of transistors 36 are connected to $V_{cc}$. The input 37 is connected to the gate of a N-channel inverting transistor 38 having its source connected to ground and its drain connected to the input of the P-channel serpentine gate 16 and to the drain of the first pull-up transistor 36. Similarly, a plurality of N-channel pull-down transistors 40 is connected with their drains connected to successive points on the N-channel serpentine gate 24, the sources of transistors 40 being tied to ground and their gates connected to the input terminal 37. A P-channel inverting transistor 44 is connected at its gate to the input terminal 37, the source of transistor 44 connected to $V_{cc}$ and its drain connected to the drain of the first pull-down transistor 40 and to the input of the N-channel serpentine gate 24.

It should be noted that while FIG. 1 illustrates a representative output pair 10 of a CMOS device, the relative sizes of the P-channel transistor 12 and the N-channel transistor 14 may vary according to the desired application. Both the size and the number of the sources and drains of the transistors may vary accordingly, without effect on the present invention. Similarly, the number of pull-up transistors 36 and pull-down transistors 40 may also vary depending upon the application. CMOS pair 10 is constructed similarly to known CMOS circuits, except that the serpentine gates 16 and 24 are uniquely formed in order to slow down the conduction of the pair in order to reduce or eliminate spikes or noise at the circuit output.

As is known, a P-channel transistor conducts between source and drain when the gate voltage is negative with respect to the source voltage. Therefore, if the source is tied to $V_{cc}$, a P-channel transistor will conduct when a "low" signal is present at its gate and will not conduct when a "high" signal is present at its gate. Conversely, a N-channel transistor will conduct between source and drain when the gate voltage is positive with respect to the source voltage. Thus, if the source of a N-channel transistor is tied to ground, it will conduct when a "high" signal is present at its gate and not conduct when a "low" signal is present at the gate. A transistor is "turned-on" if it is in a conducting (low impedance) state, and is "turned-off" if it is in a non-conducting (high impedance) state.

The P-channel transistor 12 is comprised of many sub-transistors 21a-j connected in parallel. In the illustrated embodiment, the P-channel transistor 12 comprises ten such sub-transistors. For example, the first sub-transistor 21a includes the source 18a, the drain 20a and a leg of the serpentine gate 16 therebetween. The second sub-transistor 21b comprises the drain 20a, the source 18b, and a leg of the serpentine gate 16 therebetween. The last sub-transistor 21j includes the drain 20e, the source 18f and the last leg of the serpentine polysilicon gate therebetween. The sources of each P-channel sub-transistor 21a-j are connected in parallel to $V_{cc}$, while the drains of each sub-transistor 21a-j are connected to the output 34. Similarly, the N-channel transistor 14 includes a plurality of N-channel sub-transistors 29a-f, each characterized by a source and a drain (or a drain and a source) with a leg of the serpentine polysilicon N-channel gate between. The sources of the N-channel sub-transistors 29a-f are connected in parallel to ground 32 and the drains are connected in parallel to the output 34.

In operation of the circuit of FIG. 1, assume that the input 37 to the output pair 10 is initially in a "high" state. The two complimentary pairs comprising transistors 36-38 and 40-44 act as inverters between the input 37 and the beginning of the serpentine gates 16 and 24. Thus, a "low" signal would be present at the gate 16 of the P-channel transistor 12 and at the gate 24 of the N-channel transistor 14. The low signal present at serpentine gates 16 and 24 would result in the P-channel transistor 12 being turned on and the N-channel transistor 16 being turned off. Therefore, in the initial state with a "high" input signal, the output 34 would be high, and the output circuitry capacitance 35 would be fully charged. After the output circuitry capacitor 35 is charged, only a negligible amount of current would exist from $V_{cc}$ to the output 34. With the N-channel transistor 14 turned off, there would be negligible leakage current to ground.

However, as the input 37 switches from a high signal to a low signal, the P-channel transistor 12 will turn off and the N-channel transistor 14 will turn on; thus, the output 34 will switch from a high signal to a low signal. Previously developed CMOS transistors have been designed to charge the entire gate substantially instantaneously, thus turning all the N-channel sub-transistors on simultaneously. This results in a surge of current from the output circuitry to the ground, which would in turn create a large voltage at the ground node due to inductance. The change of voltage at ground, which is a reference for all the other voltages in the circuit, would adversely affect the output voltages. Naturally, this problem is compounded when multiple outputs are switching simultaneously.

The circuit of FIG. 1, however, prevents the rush of current through the ground 32 by more gradually draining the outside circuitry capacitor 35 as follows. The serpentine polysilicon gates 16 and 24 are essentially distributed RC networks, as will be discussed in more detail below in conjunction with FIG. 2. Thus, the input current will propagate along the N-channel serpentine gate 24 according to a predetermined time interval. As the signal propagates along the serpentine gate path, the voltage will increase along the leg of the serpentine gate 24 between the source 26a and the drain 28a, increasing the voltage across the leg. When a threshold voltage is reached, the first N-channel sub-transistor 29a will turn on, allowing charge to flow from the output circuitry capacitor 35 to ground therethrough. However, the amount of current which a single sub-transistor can sink is only a fraction of what the N-channel transistor 14 could sink if all its sub-transistors 29a-f were turned on. Consequently, the dI/dT term attributable to the change in current caused by turning on the first sub-transistor 29a is relatively small in comparison to the change in current attributable to turning on an entire transistor. As the current reaches a steady state, the dI/dT term will return to zero.

As the input current continues to propagate through the N-channel serpentine gate 24, the leg between the first drain 28a and the second source 26b will also reach the threshold voltage, turning on the second sub-transistor 29b. After the second sub-transistor 29b turns on, twice as much charge will be flowing from the output circuit capacitor 35 to ground 32, but the incremental change in current will only be the current attributable to the turn-on of the second sub-transistor 29b. Thus, the dI/dT term will again be relatively small. The input signal will continue to propagate along the N-channel serpentine gate 24, successively turning on each of the six sub-transistors 29a-f contained in the N-channel transistor 14. The successive turn-on of the sub-transistors may be referred to a "graded" or "graduated" turn-on. The "graded turn-on" of the present invention provides the technical advantage of reducing noise in the output voltage.

After each sub-transistor 29a-f turns on, there will be a small increase in the current; the dI/dT term will increase from zero, but will be smaller in value than if the subtransistors 29a-f had turned on simultaneously. By the time the input signal has propagated through the entire polysilicon gate 24, all six sub-transistors 29a-f will be conducting and the current therethrough will be at its maximum rate. The rate of change of the current with respect to time, however, will have been reduced as each of the six transistors turned on. Thus, the dI/dT factor will be much less than if the entire N-channel transistor 14 turned on at once. This has been found to significantly reduce noise and spikes in the output signal.

After the charge from the output circuitry capacitor 35 has been drained through ground, the current through the ground 32 will once again be practically zero. Likewise, since the P-channel transistor 12 remains turned off, no current will exist from $V_{cc}$ to output 34.

Assuming the input 37 is now changed from low to high, in previously developed P-channel transistors, the entire P-channel transistor would turn on, allowing current from $V_{cc}$ to the output 34, charging the output circuitry capacitor 35. Since the entire P-channel transistor would be turned on at once, there would be an abrupt increase in current from $V_{cc}$ to output 34, causing a large voltage drop to occur at the $V_{cc}$ node, and causing undesirable noise in the output voltage.

However, in the present invention, the low signal present at the input of the P-channel polysilicon gate 16 will propagate along the serpentine gate 16, successively turning on the ten sub-transistors 21a-j comprising the P-channel transistor 12. As each sub-transistor 21a-j is turned on, charge from $V_{cc}$ will flow to the output circuit, thus creating a current from $V_{cc}$ to the output 34. However, as described above, the increase in the rate of flow will occur as each P-channel sub-transistor 21a-j is turned on, limiting the dI/dT term to a relatively small value. Consequently, the noise spike at the $V_{cc}$ node will be greatly reduced, thus providing substantial technical advantages.

The purpose of the pull-up transistors 36 and pull-down transistors 40 is to turn off the sub-transistors 21a-j or 29a-f simultaneously, thereby preventing a short circuit from $V_{cc}$ to ground 32. For example, with the input 37 initially in a high state, all the sub-transistors 21a-j of the P-channel transistor 12 will be turned on. As the input signal changes from high to low, the sub-transistors 29a-f of the N-channel transistor 14 will turn on incrementally and without the pull-up transistors 36, sub-transistors 21a-j of the P-channel transistor would turn off incrementally. At some point, sub-transistors of both the P-channel transistor and the N-channel transistor would be conducting simultaneously, resulting in a short from $V_{cc}$ to ground. Naturally, this would cause high currents at both the $V_{cc}$ and ground, resulting in high power dissipation in the device.

The P-channel pull-up transistors 36 serve to turn off all of the sub-transistors 21a-j of the P-channel transistor 12 at once by applying $V_{cc}$ at various points along the P-channel serpentine gate 16. In operation, the pull-up transistors will turn on in response to a low signal at their gates, and apply $V_{cc}$ along the P-channel serpentine gate 16. Thus, in the illustrated embodiment, all the legs of the polysilicon gate 16 will be charged at essentially the same time, resulting in a fast turn off of the P-channel sub-transistors 21a-j.

Likewise, the N-channel pull-down transistors 40 will operate to simultaneously turn off the sub-transistors 29a-f of the N-channel transistor 14 whenever a high signal is present at the input 37, preventing a possible short through the latter sub-transistors of the N-channel transistor 14 and the initial sub-transistors of the P-channel transistor 12.

Figure 2:
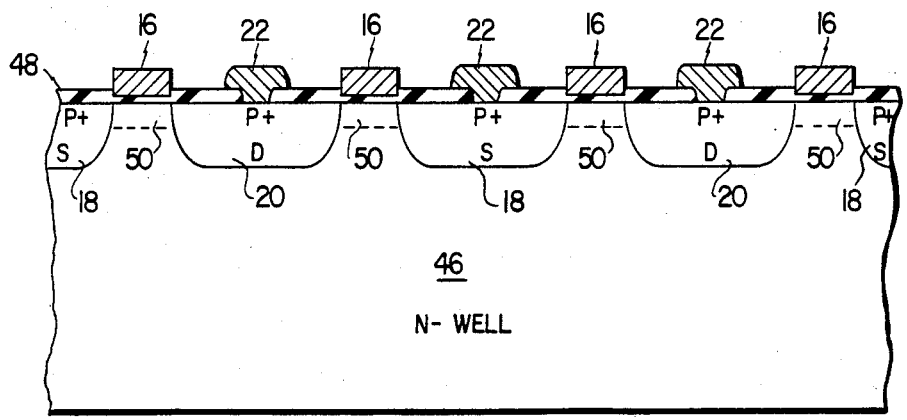
FIG. 2 illustrates a cut-away view of the P-channel transistor illustrated in FIG. 1.

Referring now to FIG. 2, a cross-section of the P-channel transistor 12 is shown to illustrate the source of the resistive-capacitive effect, which resists propagation of a signal along the P-channel serpentine gate 16. The polysilicon gate 16 is known to have predetermined resistance. The sources 18 and drains 20 of the P-channel transistor 12 are shown formed by conventional techniques into a N-well 46. A silicon dioxide layer 48 covers the sources 18, drains 20 and N-well 46. The silicon dioxide layer over the N-well 46 is very thin and is known as the "gate oxide". The metal contacts 22 extend through the silicon dioxide layer 48 and contact the sources 18 and drains 20. Fabrication of transistors 12 and 14 is by conventional techniques and will not thus be described in detail. Conducting channels 50 between the sources and drains are illustrated with dotted lines to show the channels are present only when there is a negative voltage on the gate 16 with respect to the source 18. In the present case, the negative voltage will be present when a source 18 is connected to $V_{cc}$ and its respective leg of the serpentine gate 16 is brought to ground.

While parasitic capacitance exists between the gates 16 and sources 18 and between the gate 16 and the drain 20, the main source of capacitance will be created by the conducting channels 50 and the polysilicon gates 16 acting as conductors, and the thin silicon dioxide layer acting as a dielectric therebetween. Similar structure creates resistance and capacitance in the case of the N-channel transistor 14. The capacitance and resistance of the present circuit thus cause a predetermined time delay in the propagation of the input signal through the serpentine gate.

FIG. 3 illustrates the advantageous effect that the "graded turn-on" has on the outputs of a device. FIG. 3 is a graph of voltage versus time. Several outputs, switching from high to low, are designated by graph line 51. A single unswitched output maintaining a low output is designated by graph line 52. The multi-switched outputs and unswitched output of a device not using the "graded turn-ons" of this invention are illustrated by graph lines 54 and 56, respectively. The minimum tolerable limit for a high signal in this instance has been chosen to be slightly greater than three volts, while the maximum tolerable limit for a low voltage signal was set at slightly less than one volt. The high voltage limit is the lowest voltage which is guaranteed to be recognized as a high voltage by other devices, and the low limit is the highest voltage which is guaranteed to be recognized as a low signal by other devices. Although CMOS devices will recognize a signal which is less than half of the supply voltage $V_{cc}$ (normally 5 volts) as being a low signal, it is necessary to set the low voltage limit at less than one volt in order to ensure compatibility with bipolar devices.

As illustrated by FIG. 3, devices using the graded turn-on of the output pair 10, exhibit less severe output voltage fluctuations than their prior counterparts. Specifically the prior device outputs illustrated by graph lines 54 and 56 have severe voltage spikes 62 and 64, respectively. Devices using the present invention exhibit relatively smooth switching as shown by graph lines 51 and 52. As depicted in FIG. 3, the voltage created at the power and ground nodes will affect not only the switched outputs 51 and 54 (those outputs switching from a high to low, or low to high voltage level), but also the voltage of the unswitched outputs 52 and 56 (outputs which are not changing). This problem is compounded as more outputs are switching simultaneously, because the current into the ground and $V_{cc}$ node will be much greater.

The danger of extreme fluctuation of the outputs of a device is illustrated by the peaks 62 and 64 of the outputs of devices not using graded turn-on circuitry. If the output of a device rises above the low voltage threshold, generally 2.5 volts, other CMOS devices will no longer recognize the outputs as being a low level, resulting in "false" outputs. The problem is more acute when driving bipolar devices, since the low voltage limit is only 0.8 volts above a "true" low signal of zero volts.

False outputs can lead to false signals being propagated throughout a digital system; consequently, customers have sometimes been reluctant to invest in high speed CMOS devices. However, the disclosed invention reduces output fluctuation due to inductive voltages on the power supply and ground nodes, such that false signals are no longer a danger.

FIG. 4 illustrates an alternative embodiment of the N-channel transistor 14, shown in FIG. 1. In this embodiment, the N-channel transistor 14 is formed in the same manner as previously described, but with the serpentine gate 68 being extended over a "dummy" N-channel 66. Because a N-channel transistor has a much higher current sinking capability than a P-channel transistor of the same size, a complimentary output pair, such as the output pair 10 illustrated in FIG. 1, can have a N-channel transistor 14 which is one-third as big as the P-channel transistor 12. Thus, the N-channel serpentine gate 24 may have approximately one-third the resistance of the P-channel serpentine polysilicon gate 16, and may produce about one-third of the capacitance. This results in a R-C time constant product which is roughly one-ninth of the R-C time constant product of the P-channel transistor 12. Consequently, the effectiveness of the graded turn-on in the N-channel devices may be only about one-ninth as effective as in P-channels.

The dummy N-channel 66 provides additional capacitance along the path of the extended serpentine polysilicon gate 68, while the extended length adds extra resistance to the path of the gate 68. The additional capacitance and resistance provided by the dummy N-channel 66 and extended serpentine gate 68 can be adjusted to provide an acceptable level of graded turn-on. The amount of additional resistance and capacitance may be modified merely by adjusting the length of the serpentine gate 68. The dummy N-channel 66 is constructed identically to transistor 14, with the exception that metal contacts 30 are not required.

Referring now to FIG. 5, another alternative embodiment of N-channel transistor 14 is illustrated. In this embodiment, a portion of the N-channel has been cut away, so that the area of sub-transistors 70a-c will be reduced. Consequently, the smaller sub-transistors will sink relatively less current than the full size sub-transistors 70d-f. Thus, as the signal propagates through the N-channel serpentine polysilicon gate 24, the dI/dT factor associated with the smaller subtransistors 70a-c will be relatively small in comparison with the dI/dT factor associated with the larger sub-transistors 70d-f. This will result in the technical advantage of a reduced dI/dT magnitude, and will further reduce output noise.

An additional benefit of the embodiment of FIG. 5 is that the longer path of the polysilicon gate 24 results in more resistance. The higher resistance will facilitate a slower propagation of the signal along the N-channel polysilicon gate 24, thereby further reducing the output voltage noise.

It should be noted that the N-channel transistor of this embodiment should sink the same amount of current as the N-channel transistor 14 of FIG. 1. Therefore, it may be necessary to add additional channels at the end of this alternative embodiment, in order to create a transistor having the same gate area. Naturally, it may be advantageous to combine the embodiment of FIG. 5 with the embodiment of FIG. 4 in order to produce the most desirable N-channel transistor 14.

Thus, the present invention provides advantages as discussed above, as well as numerous other advantages.

As will be apparent to those skilled in the art, the present invention can be widely modified and varied. The scope of the invention is not limited, except as set forth in the accompanying claims.

TECHNICAL ADVANTAGES OF THE INVENTION

It is an important technical advantage that the invention may be used to reduce inductive voltages at the power supply and ground nodes of an integrated circuit by reducing the change in current through the nodes with respect to time in response to switching output voltages. It is a further technical advantage that the invention reduces the change in current with respect to time by sequentially causing conduction of all the subtransistors of an output transistor over an interval of time.

It is yet a further technical advantage that the interval of time over which the subtransistors become conductive may be adjusted by varying the length of a serpentine gate. In yet another technical advantage, the serpentine gate can be extended over another semiconductor region in order to further increase the time in which a signal propagates along the serpentine gate, thus causing conduction of the subtransistors.

Another important technical advantage is that the invention may be used with N-channel, P-channel and other transistors to reduce inductive voltages at the power supply and ground nodes of an integrated circuit.

What is claimed is:

1. A transistor comprising:
   a substrate having a first semiconductor region comprised of semiconductor surface areas forming a plurality of transistor regions; and
   an elongated gate having a predetermined resistance and being disposed adjacent said semiconductor surface areas in a series configuration such that a gate signal applied to one end region of said gate propagates along the length of said gate in a predetermined time interval;
   the propagation of said gate signal along said gate causing sequential conduction of ones of said transistor regions until all of said transistor regions are conducting said sequential conduction reducing the generation of output noise by said transistor.

2. The transistor of claim 1 wherein said elongated gate is configured in a continuous serpentine configuration over said semiconductor surface areas.

3. The transistor of claim 1 and further comprising a second semiconductor region separate from said semiconductor surface areas, said elongated gate also disposed adjacent said second semiconductor region such that the resistance of said elongated gate is increased by its increased length.

4. The transistor of claim 1, wherein said elongated gate is formed of polysilicon with elongated regions extending parallel to sources and drains of said transistor and joined at end regions by short regions perpendicular to said sources and drains to form a single continuous serially-connected gate.

5. The transistor of claim 1 wherein said transistor regions have varying geometric areas;
   at least one of said transistor regions being located at a point along the path of propagation of said gate signal and having a greater geometric area than another transistor region located at a point earlier along said conducting path; and
   said gate extending over areas outside said another transistor in order to provide sufficient gate length to create desirable input signal propagation delay.

6. The transistor of claim 3 wherein said transistor regions have varying geometric areas;
   at least one of said transistor regions being located at a point along the path of propagation of said gate signal and having a greater geometric area than another transistor region located at a point earlier along said conducting path; and
   said gate extending over areas outside said another transistor region in order to provide sufficient gate length to create desirable input signal propagation delay.

7. The transistor of claim 6, wherein said transistor further comprises a plurality of turn-off transistors, said turn-off transistors having drains connected to said elongated gate such that all said transistor regions are substantially simultaneously rendered non-conductive in response to a signal applied at one end of said elongated gate.

8. A transistor circuit comprising:
   a body of semiconductor material;
   a plurality of active semiconductor regions associated with said body to form alternating transistor sources and drains;
   an elongated conductive gate disposed adjacent said active semiconductor regions to form a plurality of interconnected transistors, said gate having a resistance and configured in a continuous serpentine manner such that a gate signal applied to one end thereof propagates serially along said gate to sequentially render ones of said transistors conductive.

9. A transistor circuit comprising:
   a body of semiconductor material;
   a plurality of active semiconductor regions associated with said body to form alternating transistor sources and drains;
   an elongated conductive gate disposed adjacent said active semiconductor regions to form a plurality of interconnected transistors, said gate having a resistance and configured in a continuous serpentine manner such that a gate signal applied at one end thereof propagates serially along said gate to sequentially render ones of said transistors conductive;
   a second plurality of active semiconductor regions associated with said body to form alternating sources and drains; and
   a second elongated conductive gate disposed adjacent to said second plurality of semiconductor regions to form a second plurality of interconnected transistors, said second elongated gate having resistance and configured in a serpentine manner such that a gate signal applied at one end thereof propagates along said gate to sequentially render ones of said transistors conductive.

10. The transistor circuit of claim 9 wherein said drains of said first plurality of active semiconductor regions and said drains of said second plurality of active semiconductor regions are connected to form an output.

11. The transistor circuit of claim 9 wherein said sources of said first plurality of active semiconductor regions are connected to the power supply of the transistor circuit and the sources of said second plurality of active semiconductor regions are connected to ground.

12. The transistor circuit of claim 11 wherein an input is connected to said first and second elongated gates.

13. The transistor circuit of claim 12 wherein an invertor is placed between said input and said first and second elongated gates.

14. The transistor circuit of claim 12 wherein:
said input is connected to the gates of a first plurality of turn-off transistors and to a second plurality of turn-off transistors;
the drains of said first set of turn-off transistors connected to successive positions along said first elongated gate, and the sources of said first set of turn-off transistors connected to the power supply of said transistor circuit;
the drains of said second set of turn-off transistors connected to successive positions along said second elongated gate and the sources of said second set of turn-off transistors connected to the circuit ground;
said first plurality of turn-off transistors disposed to apply the power supply voltage to said first elongated gate when a logical high signal is present at one end of said first elongated gate; and
said second plurality of turn-off transistors disposed to apply ground to said second elongated gate when a logical low signal is present at one end of said second elongated gate.

15. The transistor circuit of claim 9 wherein said second elongated gate has an extended region disposed beyond said second plurality of interconnected transistors, such that the resistance of said second elongated gate is increased.

16. The transistor circuit of claim 9 wherein said second extended region of elongated gate is disposed adjacent a third plurality of semiconductor regions such that the capacitance of said second elongated gate is increased.

17. A CMOS transistor circuit having low output noise comprising:
a semiconductor body;
a P-channel transistor formed by a plurality of active semiconductor regions associated with said body;
a N-channel transistor formed by a plurality of active semiconductor regions associated with said body;
said P-channel and said N-channel transistors interconnected to generate an output signal in response to an input signal;
each of said transistors including a series serpentine conductive gate disposed adjacent said respective active semiconductor regions and coupled to receive the input signal, said conductive gate having a predetermined resistance such that said input signal propagates along the length of said gate during a predetermined time period.

18. A method of reducing noise in the output signal of semiconductor transistor which includes a plurality of transistor regions, comprising:
applying an input signal to a first one of said transistor regions to render said one transistor region conductive;
propagating said input signal sequentially along a serpentine gate such that the remainder of said transistor regions are sequentially rendered conductive; and
generating an output signal during the sequential conduction of said transistor regions in order to reduce noise spikes in said output signal.

19. The method of claim 18, and further comprising applying a second input signal to all of said transistor regions substantially simultaneously after generating said output signal in order to render said transistor regions non-conductive.

20. The method of claim 18 and further comprising adding delay to the propagation of said input signal after said input signal has rendered ones of said transistor regions conductive.

21. The method of claim 19 wherein said delay is added by propagating said input signal adjacent to a semiconductor region in order to provide capacitive delay.

22. The method of claim 18, and further comprising fabricating transistor regions having lesser and greater areas such that transistor regions having lesser areas are rendered conductive before transistor regions having greater areas are rendered conductive.

* * * * *